United States Patent
Suemori

(10) Patent No.: US 11,632,883 B2
(45) Date of Patent: Apr. 18, 2023

(54) ELECTRONIC COMPONENT

(71) Applicant: Murata Manufacturing Co., Ltd., Nagaokakyo (JP)

(72) Inventor: Yoshiharu Suemori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 37 days.

(21) Appl. No.: 17/458,623

(22) Filed: Aug. 27, 2021

(65) Prior Publication Data

US 2021/0392798 A1    Dec. 16, 2021

Related U.S. Application Data

(63) Continuation of application No. PCT/JP2020/007716, filed on Feb. 26, 2020.

(30) Foreign Application Priority Data

Mar. 8, 2019  (JP) ............... JP2019-042598

(51) Int. Cl.
  *H05K 9/00*      (2006.01)
  *H01L 23/552*    (2006.01)
  *H05K 13/00*     (2006.01)

(52) U.S. Cl.
  CPC ......... *H05K 9/0088* (2013.01); *H01L 23/552* (2013.01); *H05K 9/0045* (2013.01); *H05K 13/00* (2013.01)

(58) Field of Classification Search
  CPC .................... H05K 9/0045; H01L 23/552
  See application file for complete search history.

(56) References Cited

U.S. PATENT DOCUMENTS

2001/0039309 A1   11/2001  Ushijima et al.
2015/0235966 A1*  8/2015   Ohhashi .............. H01L 23/552
                                            257/659

(Continued)

FOREIGN PATENT DOCUMENTS

JP    2001-279102 A    10/2001
JP    2006-286915 A    10/2006

(Continued)

OTHER PUBLICATIONS

Official Communication issued in International Patent Application No. PCT/JP2020/007716, dated Apr. 7, 2020.

*Primary Examiner* — Hung V Ngo
(74) *Attorney, Agent, or Firm* — Keating & Bennett, LLP

(57) ABSTRACT

A method of manufacturing an electronic component includes temporarily fixing an electronic component body to a support with a temporary fixation material having an area smaller than that of the electronic component body interposed therebetween, disposing a shield resin layer having an area larger than that of an upper surface of the electronic component body on the upper surface of the electronic component body, and applying pressure to the shield resin layer via an elastic layer and causing the shield resin layer to adhere such that the shield resin layer extends from the upper surface that is the surface of the electronic component body opposite to the temporary fixation material to a bottom surface that is a surface of the electronic component body that faces the temporary fixation material via side surfaces of the electronic component body.

9 Claims, 2 Drawing Sheets

(56) References Cited

U.S. PATENT DOCUMENTS

| | | | |
|---|---|---|---|
| 2016/0300799 A1* | 10/2016 | Han | H01L 23/49838 |
| 2017/0236786 A1* | 8/2017 | Suzuki | H01L 23/49811 |
| | | | 257/659 |
| 2019/0363055 A1* | 11/2019 | Yazaki | H01L 23/3121 |
| 2019/0379343 A1 | 12/2019 | Miyahara | |
| 2022/0319767 A1* | 10/2022 | Saito | H01F 17/0013 |

FOREIGN PATENT DOCUMENTS

| | | |
|---|---|---|
| JP | 2011-151372 A | 8/2011 |
| JP | 2014-127525 A | 7/2014 |
| JP | 2015-216292 A | 12/2015 |
| JP | 2017-199871 A | 11/2017 |
| WO | 2018/159481 A1 | 9/2018 |

* cited by examiner

ELECTRONIC COMPONENT

CROSS REFERENCE TO RELATED APPLICATIONS

This application claims the benefit of priority to Japanese Patent Application No. 2019-042598 filed on Mar. 8, 2019 and is a Continuation Application of PCT Application No. PCT/JP2020/007716 filed on Feb. 26, 2020. The entire contents of each application are hereby incorporated herein by reference.

BACKGROUND OF THE INVENTION

1. Field of the Invention

The present invention relates to a method of manufacturing an electronic component that includes a shield layer on an outer surface, and an electronic component.

2. Description of the Related Art

Various kinds of electronic components each of which includes a shield layer on an outer surface have been disclosed. In Japanese Unexamined Patent Application Publication No. 2017-199871 described later, for example, electronic component elements are stacked on a substrate. A mold resin layer is disposed so as to cover the electronic component elements. The shield layer is disposed on a side surface and an upper surface of the mold resin layer. It is disclosed that the shield layer is formed by, for example, sputtering.

In an electronic component disclosed in Japanese Unexamined Patent Application Publication No. 2017-199871, the shield layer is preferably formed so as to extend to a bottom surface of the substrate, that is, a bottom surface of the electronic component, in addition to a side surface of the substrate. This enables an electromagnetic shield effect to be increased. However, in the case where the shield layer described above is disposed so as to extend from the side surface of the substrate to the bottom surface of the substrate by using sputtering, there is a possibility that the shield layer is separated, or disconnection occurs on a ridge line portion between the side surface of the substrate and the bottom surface of the substrate. Accordingly, it is difficult to achieve a sufficient shield effect that extends to the bottom surface of the electronic component.

SUMMARY OF THE INVENTION

Preferred embodiments of the present invention provide methods of manufacturing electronic components that each enable a shield layer that extends to a bottom surface of the electronic component to be provided with certainty, and electronic components that are each obtained by such methods of manufacturing the electronic components.

A method of manufacturing an electronic component according to a preferred embodiment of the present invention includes fixing an electronic component body to a support with a temporary fixation material that has an area smaller than that of the electronic component body in a plan view interposed therebetween, disposing an electromagnetic-shielding shield resin layer that has an area larger than that of a surface of the electronic component body opposite the temporary fixation material in a plan view on the surface of the electronic component body, and applying pressure to the shield resin layer via an elastic layer and causing the shield resin layer to adhere such that the shield resin layer extends from the surface opposite a surface of the electronic component body that faces the temporary fixation material to the surface of the electronic component body that faces the temporary fixation material via a side surface of the electronic component body.

An electronic component according to a preferred embodiment of the present invention includes an electronic component body including an upper surface, a bottom surface, and a side surface that connects the upper surface and the bottom surface to each other, a shield resin layer extending from the upper surface of the electronic component body to the bottom surface of the electronic component body via the side surface. The shield resin layer is rounded on a ridge line between the upper surface of the electronic component body and the side surface of the electronic component body and on a ridge line between the side surface of the electronic component body and the bottom surface of the electronic component body.

Methods of manufacturing electronic components according to preferred embodiments of the present invention each enable a shield resin layer that extends to a bottom surface of the electronic component to be provided with certainty and provide electronic components that each have an excellent shield effect.

Electronic components according to preferred embodiments of the present invention each have a good electromagnetic shield effect due to a shield resin layer that extends to a bottom surface.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will hereinafter be described with reference to the drawings to clarify the present invention.

The preferred embodiments are described by way of examples in the present specification. Features can be partially replaced or combined between the different preferred embodiments.

Figure 1A:
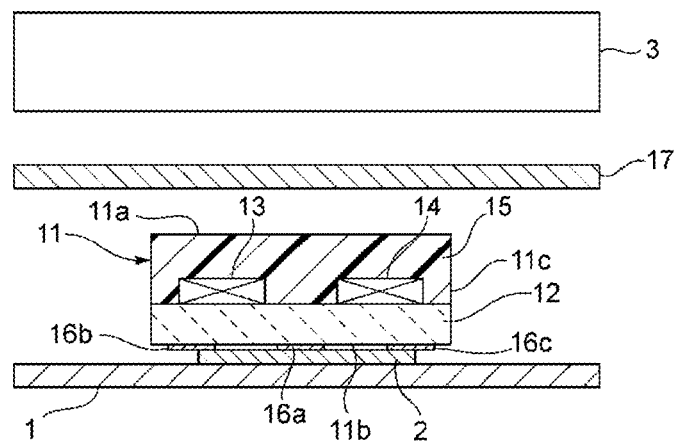
FIGS. 1A to 1C illustrate front sectional views for description of a method of manufacturing an electronic component according to a preferred embodiment of the present invention.
Figure 1B:
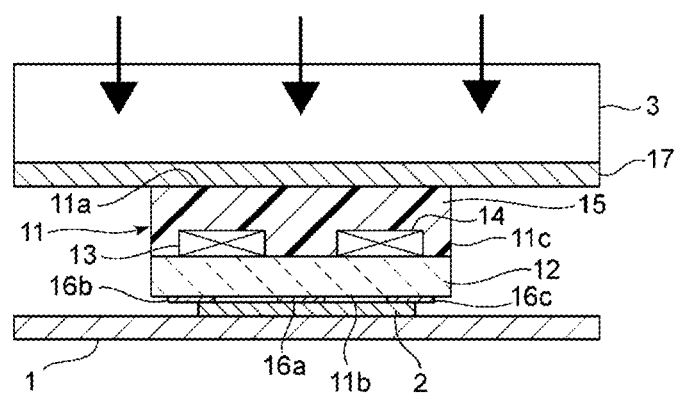
Figure 1C:
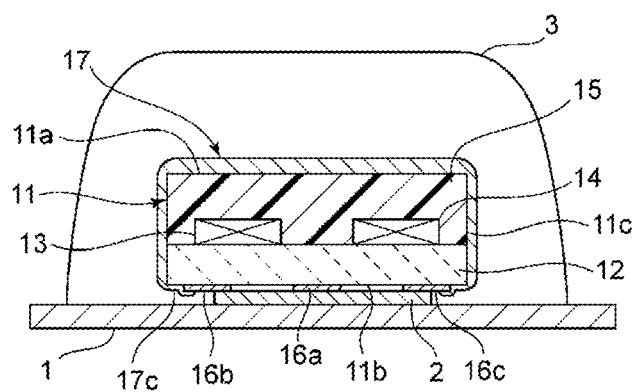
Figure 2:
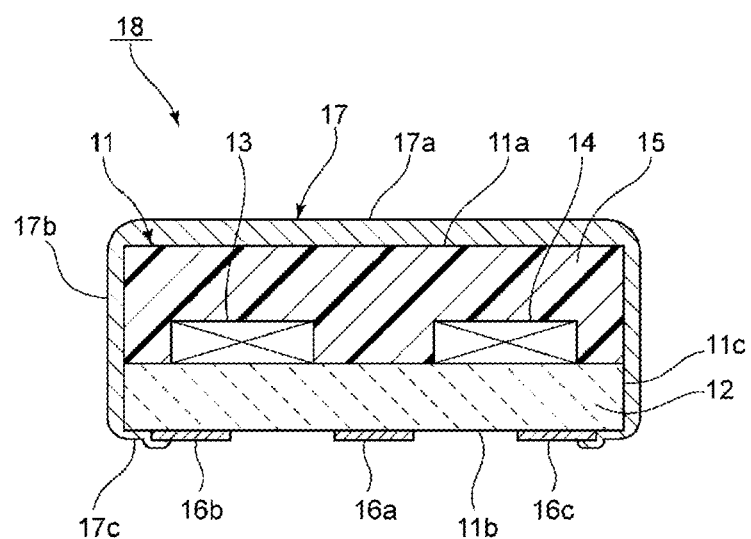
FIG. 2 is a front sectional view of an electronic component according to a preferred embodiment of the present invention.

FIGS. 1A to 1C illustrate front sectional views for description of a method of manufacturing an electronic component according to a preferred embodiment of the present invention. FIG. 2 is a front sectional view of an obtained electronic component.

As illustrated in FIG. 1A, a temporary fixation material 2 is fixed to a support 1 that has a plate shape. The support 1 is made of an appropriate material such as, for example, metal or ceramics. The support 1 does not necessarily have the plate shape but can have an appropriate shape that enables the temporary fixation material 2 and an electronic component body described later to be supported.

The temporary fixation material 2 is fixed to an upper surface of the support 1 in an appropriate manner such as, for example, an adhesive. An upper surface of the temporary fixation material 2 is an adhesive surface such that an electronic component body 11 can be temporarily fixed. The upper surface of the temporary fixation material 2 can be provided by, for example, an adhesive layer. The area of the temporary fixation material 2 in a plan view is smaller than the area of the electronic component body 11 in a plan view.

The electronic component body 11 is temporarily fixed to the temporary fixation material 2 described above. The electronic component body 11 can be temporarily fixed in a manner in which a bottom surface 11b that is a surface of the electronic component body 11 that faces the temporary fixation material 2 is bonded to the adhesive surface of the upper surface of the temporary fixation material 2 described above.

The electronic component body 11 described above includes a substrate 12, electronic components 13 and 14 disposed on the substrate 12, and a mold resin layer 15. Electrodes 16a to 16c are disposed on a bottom surface of the substrate 12. A step of disposing the electrodes 16a to 16c in such a manner may be performed before a step of applying pressure to a shield resin layer 17 described later. The electrodes 16a to 16c are electrically connected to the electronic component 13 or the electronic component 14. The electrode 16a is a hot electrode. The electrodes 16b and 16c are ground electrodes that are connected to a ground potential.

According to the present preferred embodiment, the electronic component body 11 is included in an electronic component module that includes the electronic components 13 and 14.

The substrate 12 described above is made of appropriate insulating ceramics such as, for example, alumina. The substrate 12, however, may be made of another insulating material such as, for example, synthetic resin.

The electronic components 13 and 14 are stacked on the substrate 12. The kinds of the electronic components 13 and 14 are not particularly limited. For example, active electronic components such as a surface acoustic wave device, a bulk acoustic wave device, a switch, and an amplifier and various electronic components such as a capacitor and an inductor can be provided.

The mold resin layer 15 covers the electronic components 13 and 14. The mold resin layer 15 is provided to increase humidity resistance and to protect the electronic components 13 and 14. For example, appropriate thermosetting resin such as epoxy resin, silicon resin, acrylic resin, urethane resin, and imide resin can be used as the mold resin layer 15.

The shield resin layer 17 is provided on an upper surface 11a of the electronic component body 11 after the electronic component body 11 described above is temporarily fixed to the temporary fixation material 2. In this case, resin with a viscosity enabling the resin to maintain its shape at room temperature, for example, resin the viscosity of which is about 8 Pa·s or more at about 20° C. is used as the shield resin layer 17. As illustrated in FIG. 1B, an elastic layer 3 is stacked on the shield resin layer 17. The area of the shield resin layer 17 in a plan view is larger than the area of the upper surface 11a that is the surface of the electronic component body 11 opposite the temporary fixation material 2. Subsequently, as illustrated by arrows in FIG. 1B, pressure is applied by an isostatic press or vacuum aspiration, for example.

An electromagnetic shield material in which conductive particles of, for example, silver, copper, or carbon or magnetic particles of, for example, ferrite disperse in synthetic resin such as thermoplastic resin, and appropriate thermosetting resin such as, for example, epoxy resin, silicon resin, acrylic resin, urethane resin, or imide resin can be used as the shield resin layer 17 described above. That is, the shield resin layer may be a resin layer that includes a conductive material or a magnetic material. However, the materials described above are not limited thereto, provided that a target shield effect is achieved.

When the electronic component body 11 is temporarily fixed, the electrode 16a that is not electromagnetically shielded and that is disposed on the bottom surface of the substrate 12 of the electronic component body 11 is preferably masked using an adhesive tape or resist, for example. This prevents the shield resin layer 17 from extending to a position on the electrode 16a.

When the pressure is applied, it is preferable that heat is generated, and the pressure is applied at a temperature equal to or more than the melting temperature of the resin in the shield resin layer 17 described above within a gel time. This makes the shield resin layer 17 easy to deform along the external shape of the electronic component body 11. The pressure is preferably applied by using, for example, the isostatic press, and consequently, the elastic layer 3 causes the shield resin layer 17 to deform with certainty.

As illustrated in FIG. 1C, the shield resin layer 17 adheres to an outer surface of the electronic component body 11 so as to extend from the upper surface 11a of the electronic component body 11 to the bottom surface 11b via side surfaces 11c of the electronic component body 11. The side surfaces 11c of the electronic component body 11 are surfaces that connect the bottom surface 11b and the upper surface 11a of the electronic component body 11. As illustrated in FIG. 2, an electronic component 18 that is obtained by the method of manufacturing the electronic component according to the present preferred embodiment includes four side surfaces 11c. The phrase "to extend to the bottom surface" in the present specification means to extend to at least a region on the bottom surface.

In the electronic component 18, the shield resin layer 17 extends to positions on the electrodes 16b and 16c that are connected to the ground potential. In this way, the shield resin layer 17 is electrically connected to the electrodes 16b and 16c. Consequently, the electromagnetic shield effect can be further increased. Accordingly, the shield resin layer 17 may extend so as to be on the entirety or substantially the entirety of the electrodes 16b and 16c, provided that the shield resin layer 17 extends to at least positions on portions of the electrodes 16b and 16c that are connected to the ground potential.

The surface of the shield resin layer 17 is rounded on ridge lines between the side surfaces 11c and the upper surface 11a of the electronic component body 11 and on ridge lines between the side surfaces 11c and the bottom surface 11b. For this reason, disconnection and separation of the shield resin layer 17 are unlikely to occur even when portions of the shield resin layer 17 on the above-described ridge lines come into contact with another member or component.

Figure 3:
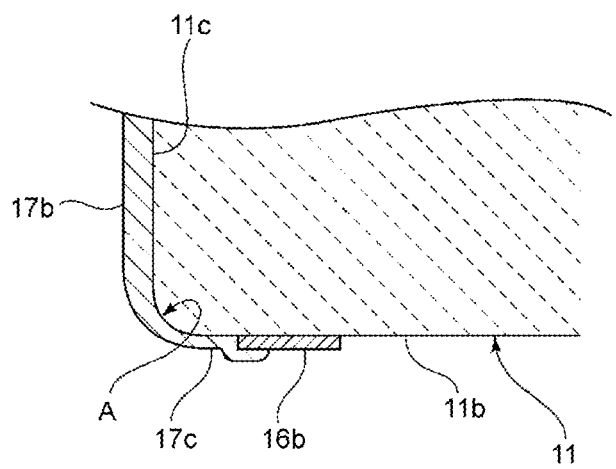
FIG. 3 is an enlarged front sectional view of a principal portion according to a modification of a preferred embodiment of the present invention.

A ridge line portion A of the electronic component body 11 is more preferably rounded as in a modification of a preferred embodiment of the present invention that is illustrated in FIG. 3. In this case, disconnection and separation of the shield resin layer 17 described above can be more effectively prevented from occurring.

In the electronic component 18 that is obtained in the above manner, as illustrated in FIG. 2, the electrodes 16b and 16c are provided inside the outer circumference of the bottom surface 11b, that is, corners of the electronic component body 11 that are defined by the side surfaces 11c and the bottom surface 11b in a plan view of the bottom surface 11b of the electronic component body 11. The shield resin layer 17 is also provided on regions on the bottom surface 11b between the corners and the electrodes 16b and 16c, that is, on at least portions of regions on the bottom surface 11b on which the electrodes 16b and 16c are not provided. In this case, the electrodes 16b and 16c are in contact with the corners defined by the side surfaces 11c and the bottom surface 11b, that is, are in contact with the outer circumference of the bottom surface 11b, and separation of the shield resin layer 17 is even more unlikely to occur than in the case where the shield resin layer 17 at the bottom surface 11b is provided only on the electrodes 16b and 16c. The reason is that the synthetic resin that is included in the shield resin layer 17 is likely to be in close contact with the insulating material of the substrate 12 on the bottom surface 11b of the electronic component body 11 unlike, for example, the metal of the electrodes 16b and 16c. Accordingly, a structure in which the electrodes 16b and 16c are provided inside the outer circumference of the bottom surface 11b makes disconnection and separation of the shield resin layer 17 unlikely to occur. The substrate 12 on which the electrodes 16b and 16c are provided may be obtained by dividing a collective board into individual pieces. At this time, the electrodes 16b and 16c that are hard are not cut when the substrate 12 is obtained as an individual piece from the collective board in the case where the electrodes 16b and 16c are provided inside a portion corresponding to the substrate 12. Accordingly, a burr and falling of the electrodes can be prevented from occurring, and this is advantageous also for the close contact of the shield layer.

In the electronic component 18 that is obtained in the above manner, as illustrated in FIG. 2, the shield resin layer 17 includes first to third portions 17a to 17c. The first portion 17a is located on the upper surface 11a of the electronic component body 11. The second portion 17b is located on the side surfaces 11c. The third portion 17c is located on the bottom surface 11b. In addition, t1>t2>t3 is preferably satisfied where t1, t2, and t3 are the thicknesses of the first portion 17a, the second portion 17b, and the third portion 17c, respectively. In this case, the heat capacity of the first portion 17a is high, and heat that is generated by the electronic components 13 and 14 is likely to dissipate to the upper surface 11a of the electronic component body 11. Heat from another electronic component and another member located adjacent to the electronic component 18 can be efficiently dissipated from the second portion 17b of the shield resin layer 17 toward the first portion 17a. For this reason, the characteristics of the electronic component 18 are unlikely to be degraded due to heat.

Accordingly, heat can be reduced or prevented from being conducted to a circuit substrate on which the electronic component 18 is mounted, and thermal degradation of an entire device that includes the circuit substrate can be effectively reduced or prevented.

The third portion 17c is relatively thin, and a height after mounting can be decreased.

The electronic component body 11 according to the preferred embodiment described above is an electronic component module that includes the electronic components 13 and 14. According to the present invention, however, the electronic component body 11 may be an electronic component module that includes only the electronic component 13 or the electronic component 14, and the electronic component body 11 may be a single electronic component, for example.

The mold resin layer 15 is disposed on the substrate 12, but this structure is not limited thereto. For example, an electronic component body that has a structure in which case members are bonded may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   an electronic component body including an upper surface, a bottom surface, and a side surface that connects the upper surface and the bottom surface to each other; and
   a shield resin layer extending from the upper surface of the electronic component body to the bottom surface of the electronic component body via the side surface; wherein
   the shield resin layer is rounded on a ridge line between the upper surface of the electronic component body and the side surface of the electronic component body and on a ridge line that between the side surface of the electronic component body and the bottom surface of the electronic component body.

2. The electronic component according to claim 1, further comprising:
   a ground electrode on the bottom surface of the electronic component body; wherein
   the shield resin layer is electrically connected to the ground electrode, and the shield resin layer extends to at least a position on a portion of the ground electrode.

3. The electronic component according to claim 2, wherein
   in a plan view of the bottom surface of the electronic component body, the ground electrode is provided inside an outer circumference of the bottom surface of the electronic component body; and
   the shield resin layer is provided on at least a portion of a region on the bottom surface of the electronic component body on which the ground electrode is not provided.

4. The electronic component according to claim 1, wherein
   a thickness of the shield resin layer on the upper surface of the electronic component body is greater than a thickness of the shield resin layer on the side surface of the electronic component body; and
   the thickness of the shield resin layer on the side surface of the electronic component body is greater than a thickness of the shield resin layer on the bottom surface of the electronic component body is satisfied.

5. The electronic component according to claim 1, wherein the shield resin layer is a resin layer that includes a conductive material or a magnetic material.

6. The electronic component according to claim 1, wherein the electronic component body includes:
   a substrate;
   at least one electronic component on the substrate; and a mold resin layer covering the at least one electronic component.

7. The electronic component according to claim 6, wherein the at least electronic component is a surface acoustic wave device, a bulk acoustic wave device, a switch, an amplifier, a capacitor or an inductor.

8. The electronic component according to claim 6, wherein the mold resin layer includes at least one of epoxy resin, silicon resin, acrylic resin, urethane resin, or imide resin.

9. The electronic component according to claim 1, wherein the shield resin layer has a viscosity of about 8 Pa·s or more at about 20° C.

* * * * *